United States Patent [19]

Rokos

[11] Patent Number: 4,954,865
[45] Date of Patent: Sep. 4, 1990

[54] INTEGRATED CIRCUITS

[75] Inventor: George H. S. Rokos, Bishop's Stortford, Great Britain

[73] Assignee: STC PLC, London, England

[21] Appl. No.: 348,258

[22] Filed: May 5, 1989

[30] Foreign Application Priority Data

May 10, 1988 [GB] United Kingdom ............... 8810973

[51] Int. Cl.⁵ .............................................. H01L 27/02
[52] U.S. Cl. ....................................... 357/43; 357/34; 357/35; 357/59 E; 357/59 H; 437/31; 437/193
[58] Field of Search .................... 357/34, 43, 35, 59 E, 357/59 H; 437/31, 193

[56] References Cited

U.S. PATENT DOCUMENTS

| | | | |
|---|---|---|---|
| 4,375,999 | 3/1983 | Nawata et al. | 357/71 |
| 4,489,341 | 12/1984 | Mayrand | 357/43 |
| 4,739,386 | 4/1988 | Tanizawa | 357/43 |
| 4,753,709 | 6/1988 | Welch et al. | 357/43 |
| 4,782,030 | 11/1988 | Katsumata et al. | 357/59 H |
| 4,825,274 | 4/1989 | Higuchi et al. | 357/43 |
| 4,829,015 | 5/1989 | Schaber et al. | 357/34 |
| 4,835,580 | 5/1989 | Havemann et al. | 357/34 |
| 4,879,255 | 11/1989 | Deguchi et al. | 357/43 |
| 4,916,517 | 4/1990 | Scovell et al. | 357/68 |

FOREIGN PATENT DOCUMENTS

| | | | |
|---|---|---|---|
| 0052450 | 5/1982 | European Pat. Off. | 357/43 |
| 0099763 | 7/1980 | Japan | 357/43 |
| 0161059 | 9/1984 | Japan | 357/34 |
| 0015961 | 1/1985 | Japan | 357/43 |
| 0194874 | 8/1986 | Japan | 357/43 |
| 62-221146 | 9/1987 | Japan | 357/43 |
| 63-37659 | 2/1988 | Japan | 357/43 |
| 2173638 | 10/1986 | United Kingdom . | |

OTHER PUBLICATIONS

Caswell, "Plessey Claims a Bipolar Speed Mark", Electronics, Aug. 20, 1987.
"Heterojunction Emitter Multiplies Transistor's Current Gain by 50", Electronics, vol. 52, No. 22, 10/25/79.

Primary Examiner—Andrew J. James
Assistant Examiner—Minh L. Tran
Attorney, Agent, or Firm—Lee, Mann, Smith, McWilliams & Sweeney

[57] ABSTRACT

An integrated circuit structure has a number of device areas each of which is configurable in a subsequent customizing process as a field effect transistor, a bipolar transistor or as a pair of those devices. Configuration of the structure is determined by correspondingly selective etching of a polysilicon layer disposed on the structure.

2 Claims, 2 Drawing Sheets

INTEGRATED CIRCUITS

This invention relates to integrated circuits, and in particular to circuits capable of accommodating both bipolar and field effect devices. The invention also relates to a method of fabricating such circuits.

BACKGROUND OF THE INVENTION

A recent development in integrated circuit technology has been the introduction of circuits incorporating both field effect transistors and polysilicon (polycrystalline silicon) emitter bipolar transistors on a common semiconductor substrate chip. Techniques of this type, which is becoming known generally as 'merged technology' are described for example in our UK specification No. 2173638 (P D Scovell et al. 15-13-8X). Whilst this technique represents a considerable technical advance by combining on a single chip the advantageous features of field effect and bipolar devices, its full potential in the custom circuit field is restricted by the requirement, prior to the provision of any custom features, to define those device regions that are to become field effect transistors and those that are to become bipolar transistors. The definition of device types at an early stage of processing places constraints on the nature of the circuit which can be provided by a subsequent customising process to interconnect the devices in a particular way.

The object of the invention is to minimise or to overcome this disadvantage.

SUMMARY OF THE INVENTION

According to the invention there is provided an integrated circuit structure adapted to provide a desired circuit function by the application thereto of a customising process, the structure including a plurality of device areas disposed on a semiconductor substrate, and a layer of polycrystalline silicon (polysilicon) provided on said semiconductor substrate, the arrangement being such that, in use, selective etching of the polysilicon layer defines a plurality of device types whereby to provide, by subsequent interconnection of the device, a desired circuit function.

By delaying final commitment of device type until a customising stage of the process the versatility of the circuit structure is increased whilst redundancy is minimised. Conventional processes effect customising of a circuit at the metallisation stage. At that stage the various circuit devices are fixed and thus the circuit function is limited to that which can be provided by interconnecting those devices in a particular manner. The present invention overcomes this limitation by providing an arrangement in which the polysilicon is also customisable to determine device type. This significantly increases the versatility of the circuit and reduces the level of inbuilt redundancy that must be provided.

BRIEF DESCRIPTION OF THE DRAWINGS

Embodiments of the invention will now be described with reference to the accompanying drawings in which.

Figure 1:
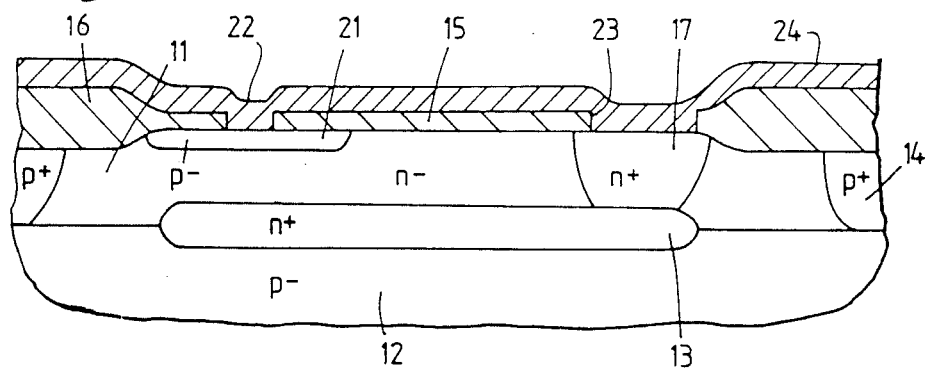
FIG. 1 is a sectional view of a basic circuit structure prior to customising to provide a finished device.

FIG .3 shows the structure of FIG.1 customised to provide both a bipolar transistor and a field effect transistor.

Figure 3:
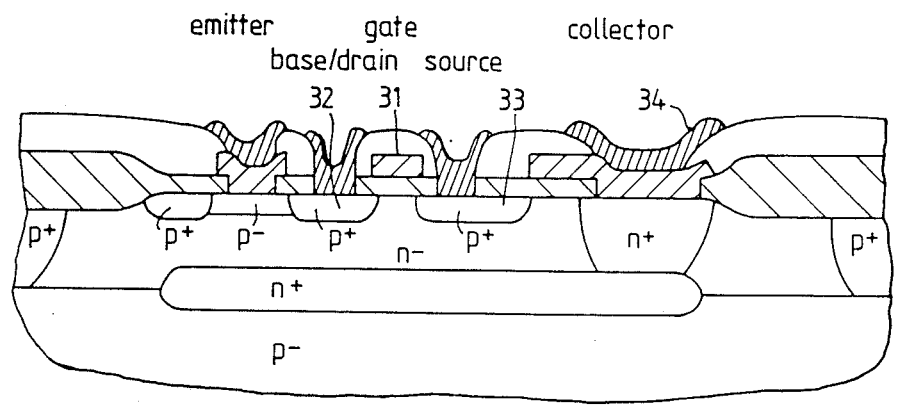
Figure 4:
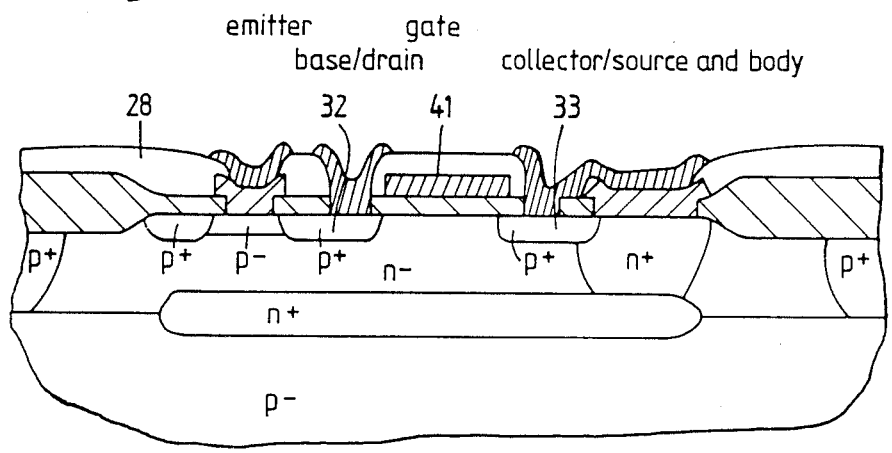
Figure 5:
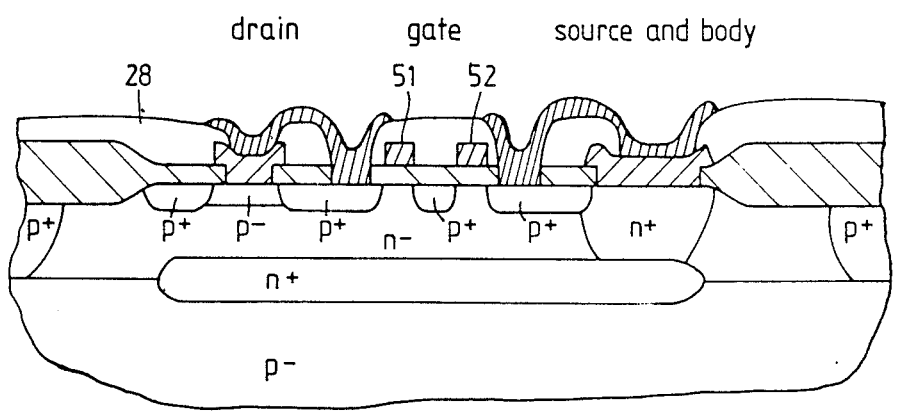

FIG. 4 shows the structure of FIG.3 modified to increase the channel length of the field effect transistor. and FIG. 5 shows the structure of FIG. 1 customised to provide a single p-channel field effect transistor.

DESCRIPTION OF PREFERRED EMBODIMENT

Referring to FIG.1, the device structure is formed in a lightly doped $n^-$-type epitaxial layer 11 disposed on a lightly doped $p^-$-type silicon substrate 12. A buried heavily doped $n^+$-type layer 13 is disposed beneath the device area and extends into both the epitaxial layer 11 and the underlying substrate 12. Isolation from adjacent devices is provided by a $p^+$-type isolation doping or implant 14 surrounding the device area.

An ion implanted or diffused heavily doped $n^+$-type sinker 17 extends from the semiconductor surface to the $n^+$-type buried region 13. The sinker may be formed via a photolithographic mask (not shown).

The surface of the device area is covered with a thin insulating layer 15, typically an oxide layer, and is surrounded by a rather thicker field oxide layer 16.The thin oxide layer 15 may be formed by pulse heating the silicon structure in an oxidising atmosphere. The structure is then provided with a photolithographic mask (not shown) through which a lightly doped $p^-$-type base region 21 is implanted into the semiconductor surface through the thin insulating layer 15

Windows 22 and 23 are etched through the thin insulating layer 15 in register with the base region 21 and the sinker 17 respectively. The whole structure is provided with a surface layer 24 of polycrystalline silicon (polysilicon). The Polysilicon is implanted, e.g. with an n-type dopant to render the material conductive. This point of the fabrication process represents the end of the pre-customising stages of manufacture. Subsequent customising process steps determine the type of device or devices to be fabricated and also determines the final circuit topography.

Figure 2:
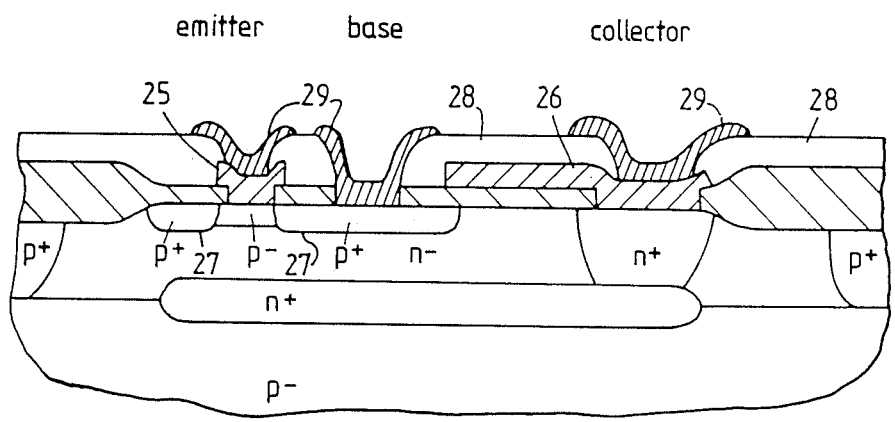
FIG. 2 shows the structure of FIG.1 after customising to provide a bipolar transistor.

FIG.2 shows the structure of FIG.1 after customising to provide a polysilicon emitter bipolar transistor. The polysilicon layer is patterned to provide a transistor emitter body 25 and a collector contact 26. Using this patterned polysilicon as a mask, a high dose implant is effected to provide $p^+$-type base contact region 27. The collector polysilicon 26 ensures that this $p^+$-type implant is separated from the $n^+$-type sinker 17. It will be appreciated that the polysilicon layer 24 can be etched only in those regions where it is separated from the substrate by the oxide layer 15, as this oxide layer provides an etch stop, thus protecting the silicon substrate and preventing undercutting of the polysilicon.

An insulating glass layer 28 is applied to the structure and is patterned with a further lithographic mask (not shown) to provide windows exposing the transistor emitter and the base and collector contacts. Finally, a metallisation pattern 29 is applied to contact the transistor via the windows in the glass layer.

The structure of FIG.3 includes both a bipolar transistor and a p-channel field effect (MOS) transistor. The fabrication process is substantially as described above with reference to FIG.2 with the exception that a polysilicon gate 31 is provided by the patterned polysilicon layer. This gate forms part of the implantation mask for the $p^+$-type implant forming the transistor base and source/drain 32 and the transistor drain/source 33. The bipolar collector terminal 34 also provides the field effect body contact.

A minor modification of the structure is shown in FIG.4 where the field effect transistor gate 41 has been extended to provide a long channel device.

FIG.5 shows the basic device structure of FIG.1 customised to form a single field effect transistor. Whilst FIG. 5 illustrates a dual gate device it will be appreciated that the technique is equally applicable to single gate structures. In this structure the bipolar emitter contact need not be opened as shown in FIG.5, but may be left covered with the glass layer 28. The patterned polysilicon forming the gates 51, 52 is used as a mask for the implantation of the p+-type source and drain regions.

The technique described above may be employed to provide various device structures at appropriate positions in the circuit layout to optimise the desired circuit function. As device type is not determined until the customising stage the degree of inbuilt redundancy is minimised.

The following fabrication sequence illustrates the techniques involved in the fabrication of the circuits described above, although it will be appreciated that the invention is not limited to this particular fabrication sequence.

Precustomising Stage

1. Mask silicon wafer, implant buried n+-type layer and prediffuse.
2. Grow epitaxial layer on wafer surface. Deposit nitride film.
3. Mask active areas of wafer and remove nitride film from field areas.
4. Partly grow field oxide.
5. Mask wafer and implant p+-type isolation regions. Diffuse isolation and complete field oxide growth.
6. Mask wafer. Implant and diffuse n+-type sinker. Remove nitride film.
7. Implant threshold adjustment surface doping. (This is a very light p-type implant that is insufficient to change conductivity type of the surface).
8. Mask and implant p−-type base region. Diffuse base and grow thin oxide.
9. Mask and etch thin oxide to form emitter and collector windows.
10. Deposit polysilicon and implant with n+-type dopant.

Customising Stage

11. Mask and etch polysilicon to determine device configuration.
12. Implant p+-type bipolar bases using patterned polysilicon as an implant mask.
13. Deposit glass (PVX) insulator layer and anneal p+-type implant
14. Mask and etch contact openings through glass layer.
15. Deposit metal; mask and etch to provide interconnection pattern.
16. Deposit passivating layer, mask and etch.
17. Test, package and retest.

The customising stages in the above sequence determine the distribution of field effect and bipolar transistor in a circuit structure and also determines the manner in which those transactions are interconnected to provide a desired circuit.

The techniques described above have particular application in the fabrication of custom analogue arrays, but are also of general custom application.

We claim:

1. An integrated circuit structure adapted to provide a desired circuit function having a structure forming an element of any array of similar structures, the structure comprising a silicon semiconductor p−-type substrate, an n−-type epitaxial layer disposed on a major surface of the substrate, an n+-type layer disposed between the epitaxial layer and the substrate and providing a burried layer below the epitaxial layer, an n+-type sinker extending from the free surface of the epitaxial layer through that layer and providing electrical contact to the buried layer, a region of p−-type material formed in the free surface of the epitaxial layer and spaced from said sinker, an insulating layer extending over the free surface of the epitaxial layer and having first and second openings in register with the p−-type region and the sinker respectively, and a layer of polycrystalline silicon (polysilicon) applied to the surface of the structure and contacting the sinker via said openings, the structure being such that it is configurable by subsequent patterning of the polysilicon layer to define a polysilicon emitter body over the p−-type region and a gate electrode on the oxide layer in a region between the emitter body and the sinker, said emitter body and gate electrode providing ion implementation masks for the fabrication of a polysilicon emitter transistor and a field effect transistor respectively.

2. An integrated circuit structure as claimed in claim 1, wherein the emitter body provides a mask for the ion implementation of a p+-type dopant into said p−-type region whereby to provide a bipolar base region.

* * * * *